United States Patent [19]

Kawanami et al.

[11] Patent Number: 5,230,987
[45] Date of Patent: Jul. 27, 1993

[54] WATER DEVELOPABLE PHOTOSENSITIVE RESIN COMPOSITION

[75] Inventors: Toshitaka Kawanami, Takarazuka; Yasushi Umeda, Kusatsu; Norihisa Osaka, Nagoya, all of Japan

[73] Assignees: Nippon Paint Co. Ltd., Osaka; Mitsubishi Rayon Co., Ltd., Tokyo, both of Japan

[21] Appl. No.: 530,171

[22] Filed: May 29, 1990

[30] Foreign Application Priority Data

May 26, 1989 [JP] Japan .................... 1-134374

[51] Int. Cl.$^5$ ............................. G03F 7/032
[52] U.S. Cl. ................... 430/284; 430/281; 430/910; 430/283; 522/116; 522/96
[58] Field of Search ............... 430/281, 910, 284, 283; 522/116, 96

[56] References Cited

U.S. PATENT DOCUMENTS

| | | | |
|---|---|---|---|
| 2,887,376 | 5/1959 | Tupis | 430/910 X |
| 2,893,868 | 7/1959 | Barney | 430/281 |
| 4,046,071 | 9/1977 | Mizuno et al. | 101/395 |
| 4,562,142 | 12/1985 | Kakumaru et al. | 430/910 X |
| 4,885,229 | 12/1989 | Takenaka et al. | 430/910 X |
| 4,950,580 | 8/1990 | Hilger | 430/910 X |

FOREIGN PATENT DOCUMENTS 0261910 3/1988 European Pat. Off. .
3322994 1/1985 Fed. Rep. of Germany .

*Primary Examiner*—Cynthia Hamilton
*Attorney, Agent, or Firm*—Wenderoth, Lind & Ponack

[57] ABSTRACT

Disclosed is a water developable photosensitive resin composition suitable for a printing plate, which has excellent dimensional stability and excellent chemical and physical properties. The photosensitive resin composition comprises;

(A) an acrylic resin of which glass transition temperature ($T_g$), as defined by $$\frac{W_1}{T_{g1}} + \frac{W_2}{T_{g2}} + \ldots = \frac{1}{T_{g0}} \quad \text{[I]}$$

[wherein $T_{g1}$, $T_{g2}$, ... represents a glass transition temperature of a homopolymer prepared from each monomer, $T_{g0}$ represents a glass transition temperature of a copolymer and $W_1$, $W_2$, ... shows a weight fraction of each monomer.] and acid value (AV) satisfy the following relations;

$$60° \text{C.} \leq T_g \leq 125° \text{C.}$$

$$80 \text{ mg KOH/g} \leq AV \leq 130 \text{ mg KOH/g, and}$$

$$T_g - 10 \leq AV \leq T_g + 40$$

(B) a basic nitrogen atom-containing compound
(C) an ethylenically unsaturated monomer, and
(D) a photopolymerization initiator.

13 Claims, No Drawings

WATER DEVELOPABLE PHOTOSENSITIVE RESIN COMPOSITION

FIELD OF THE INVENTION

The present invention relates to a water developable photosensitive resin composition. More particularly, it relates to a water developable photosensitive resin composition suitable for letterpress printing, which has excellent dimensional stability and excellent chemical and physical properties, such as durability against emulsion ink and abrasion resistance.

BACKGROUND OF THE INVENTION

A negative type photosensitive material which employs photopolymerization or photocrosslinking reaction has been used for a wide variety of applications, such as photoresist, ink, printing and the like.

In letterpress printing technique, particularly for newspapers, an automatic platemaking system has been widely introduced to speed up platemaking. In this system, for example, a piece of photosensitive resin plates is lifted with suckers from a stack of photosensitive resin plates and moved to an exposing stage. The resin plate is therefore required to have good dimensional stability.

It is also preferred that the photosensitive resin plate is developed with water rather than organic solvent or alkali aqueous solution, in view of labor's health, safety and environmental pollution. Furthermore, it is also preferred the proposed plate has good durability against ink, especially aqueous ink and emulsion ink.

In order to satisfy the above mentioned requirements, some improvements are proposed in U.S. Pat. No. 3,801,328 and Japanese Kokai Publication (unexamined) 22339/1986. The printing plate obtained from the U.S. Patent, however, is poor in durability against ink. The photosensitive resin plate of the Japanese Publication has good water developing ability, but it is poor in dimensional stability and is not suitable for the automatic platemaking system. The obtained printing plate from the Japanese Publication has good durability against ink, but it has tacky surface, which causes building up of ink on the surface. Accordingly, the printing plate has to be often washed while printing. The printing plate also has low hardness and elasticity, which causes dot gain.

SUMMARY OF THE INVENTION

The present invention provides a water developable photosensitive resin composition suitable for a printing plate, which has excellent dimensional stability and excellent chemical and physical properties. The photosensitive resin composition comprises;

(A) an acrylic resin of which glass transition temperature ($T_g$), as defined by $$\frac{W_1}{T_{g1}} + \frac{W_2}{T_{g2}} + \ldots = \frac{1}{T_{g0}} \quad [I]$$

[wherein $T_{g1}$, $T_{g2}$, ... represents a glass transition temperature of a homopolymer prepared from each monomer, $T_{g0}$ represents a glass transition temperature of a copolymer obtained from the monomer and $W_1$, $W_2$, ... shows a weight fraction of each monomer.] and acid value (AV) satisfy the following relations;

$$60° C. \leq T_g \leq 125° C.$$

$$80 \text{ mg KOH/g} \leq AV \leq 130 \text{ mg KOH/g, and}$$

$$T_g - 10 \leq AV \leq T_g + 40$$

(B) a basic nitrogen atom-containing compound
(C) an ethylenically unsaturated monomer, and
(D) a photopolymerization initiator.

The present invention also provides a printing plate obtained from the above mentioned photosensitive resin composition.

DETAILED DESCRIPTION OF THE INVENTION

The acrylic resin (A) has a glass transition temperature ($T_g$) of 60° to 125° C., preferably 70° to 120° C. If $T_g$ is less than 60° C., it is difficult to mix the above mentioned components because of tackiness, thus productivity being poor. Surface smoothness of the obtained resin plate reduces due to tackiness at sheeting and cutting, and the plate does not closely contact with a negative film. The resin plate easily gives rise to some damages (e.g. dents) because of mechanical shocks while transferring. If $T_g$ is more than 125° C., the resin plate is too hard, and cracks of the surface easily occur. The printing plate obtained from the resin plate does not smoothly fit with paper to be printed and therefore it is difficult to satisfactorily print. The preferred $T_g$ range (70° to 120° C.) keeps a good valance between resolving power, developing ability and printing properties.

The acrylic resin (A) also has an acid value (AV) of 80 to 130 mg KOH/g, preferably 90 to 120 mg KOH/g. Acid values of less than 80 mg KOH/g reduce developing ability. Acid values of more than 130 mg KOH/g reduce water resistance, such as durability against emulsion ink.

The glass transition temperature ($T_g$) and acid value have a relation of $T_g - 10 \leq AV \leq T_g + 40$. If the acid value (AV) is more than ($T_g + 40$), number of printed sheets significantly reduces, because the obtained printing plate is swelled with water or emulsion ink. If it is less than ($T_g - 10$), it takes a quite long time to develop. The printing plate easily gives rise to some damages (e.g. dents) because of mechanical shocks while transferring and does not closely contact with a negative film to result in the decline of resolution power.

The acrylic resin (A) of the present invention may be prepared by copolymerizing a monomer mixture. The monomer mixture, for example, contains (1) 10 to 25% by weight of alpha, beta-unsaturated carboxylic acid, (2) 30 to 90% by weight of an alkyl methacrylate, (3) 0 to 50% by weight of an alkyl acrylate and (4) 0 to 20% by weight of a copolymerizable monomer. Examples of the alpha, beta-unsaturated monomers are (meth)acrylic acid, itaconic acid, cinnamic acid, crotonic acid, maleic acid, fumaric acid and a mixture thereof. Examples of the alkyl (meth)acrylates are methyl (meth)acrylate, ethyl (meth)acrylate, propyl (meth)acrylate, butyl (meth)acrylate, octyl (meth)acrylate and a mixture thereof. Examples of the copolymerizable monomers are aromatic vinyl monomers, such as styrene and vinyltoluene; cyanated vinyl monomers, such as acrylonitrile and methacrylonitrile; vinyl esters, such as vinyl acetate; vinyl chloride; and a mixture thereof.

The acrylic resin may be prepared by an art-known method, such as solution polymerization, bulk polymerization, emulsion polymerization and suspension polymerization. Preferred is emulsion polymerization in view of easy control of the reaction, producibility and producing cost. Polymerization reaction can be initiated by an initiator. Typical examples of the initiators are azo compounds, such as azobisisobutylonitrile, azobisisovaleronitrile; and peroxide, such as benzoylperoxide; and the like. The emulsion polymerization may be carried out at any condition, preferably at a temperature of 40° to 100° C., for 4 to 12 hours.

Since the acrylic resin (A) is combined with the other components of the present invention to form a uniformly dispersed composition, it is preferred that the acrylic resin (A) is in the form of powder to enhance mixing ability and dispersibility. For forming powder of the acrylic resin (A), many methods are already known to the art, such as a method wherein a solvent is removed from a polymer solution and powdered; a spray dry method; a freeze dry method; a method wherein the resin is melted to form a sheet and pulverized to form powder; and a method wherein a polymer is salted out and rinsed with water. The last salting out method is preferred in view of productivity, producibility and producing cost. The acrylic resin powder prepared by the salting out method has excellent durability against an alkali solution (especially 1% sodium hydroxide solution), thus the printing plate prepared from the salting out acrylic resin powder providing good dimensional stability and durability against emulsion ink.

The salting agent employed in the salting out method is a water-soluble salt of a monovalent or polyvalent metal (e.g. sodium, potassium, calcium, magnesium, aluminum etc.). Since the monovalent metal salt is not good for solid dimensional stability of the printing plate, the polyvalent metal salt is preferred.

In case of the acrylic resin powder, its particle size is not limited, but generally within the range of 10 to 200 mesh. If it is too large, solubility or dispersibility is poor, and if it is too small, there often occurs plugging in a hopper and powder flying.

The basic nitrogen atom-containing compound (B) is a compound which has a tertiary amino group, such as 2-N-morphorinoethanol, 2-piperidinoethanol and the like. The compound (B) preferably contains both the tertiary amino group and a vinyl group, for example, a compound represented by the formula:

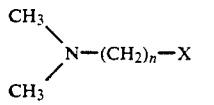

[II]

[wherein n is 1, 2 or 3, X is $-O-\underset{\underset{O}{\|}}{C}-\underset{\underset{R_1}{|}}{C}=CH_2$, $-NH-\underset{\underset{O}{\|}}{C}-\underset{\underset{R_2}{|}}{C}=CH_2$ or $-O-\underset{\underset{O}{\|}}{C}-NH-\underset{\underset{O}{\|}}{C}-\underset{\underset{R_3}{|}}{C}=CH_2$, $R_1$, $R_2$ and $R_3$ respectively show H or methyl.] and a compound represented by the formula;

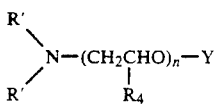

[III]

-continued

[wherein Y is H, $-\underset{\underset{O}{\|}}{C}-\underset{\underset{R_5}{|}}{C}=CH_2$, or $-\underset{\underset{O}{\|}}{C}-NH-\underset{\underset{O}{\|}}{C}-\underset{\underset{R_6}{|}}{C}=CH_2$, $R_4$, $R_5$ and $R_6$ respectively show H or methyl, n is an inter of 1 to 6 when R' is methyl and 2 to 6 when R' is ethyl.].

Preferred is the compound [III] wherein Y is not a hydrogen atom. Typical examples of the compounds (B) are N,N-dimethylaminoethyl (meth)acrylate, N,N-dimethylaminopropyl (meth)acrylate, N, N-dimethylaminoethyl-N'-(meth)acryloylcarbamate, N,N-dimethylaminoethoxyethanol, N,N-dimethylaminoethoxyethyl (meth)acrylate, a mixture thereof and the like. The basic nitrogen atom-containing compound (B) can be a combination of the compound only having a tertiary amino group with the compound [II] or [III].

The ethylenically unsaturated monomer (C) of the present invention includes an unsaturated carboxylic ester, such as n-butyl (meth)acrylate, 2-ethylhexyl (meth)acrylate, lauryl (meth)acrylate, stearyl (meth)acrylate, polyethyleneglycol mono(meth)acrylate, methoxypolyethyleneglycol mono(meth)acrylate, polypropyleneglycol mono(meth)acrylate, phenoxypolyethyleneglycol mono(meth)acrylate, ethyleneglycol di(meth)acrylate, diethyleneglycol di(meth)acrylate, triethyleneglycol di(meth)acrylate, diallyl itaconate, glycerol di(meth)acrylate, glycerol tri(meth)acrylate, 1,3-propyleneglycol di(meth)acrylate, 1,4-cyclohexanediol di(meth)acrylate, 1,2,4-butanetriol tri(meth)acrylate, glycerolpolypropyleneglycol tri(meth)acrylate, 1,4-benzenediol di(meth)acrylate, pentaerythritol tetra(meth)acrylate, tetramethyleneglycol di(meth)acrylate, 1,5-pentanediol di(meth)acrylate and 1,6-hexanediol di(meth)acrylate; an unsaturated amide, such as methylenebis(meth)acrylamide, ethylenebis(meth)acrylamide, 1,6-hexamethylenebis(meth)acrylamide, diethylenetriaminetris(meth)acrylamide, N-(hydroxymethyl)acrylamide, N-(hydroxymethyl)methacrylamide, N-(beta-hydroxyethyl)acrylamide, N-(beta-hydroxyethyl)methacrylamide, N,N'-bes(beta-hydroxyethyl)acrylamide and N,N'-bis(beta-hydroxyethyl)methacrylamide; a divinyl ester, such as divinyl adipate and divinyl phthalate; a (meth)acrylated urethane prepared by reacting a hydroxyalkyl (meth)acrylate with an isocyanate compound; a di(meth)acrylate of diepoxypolyether derived from an aromatic polyhydroxyl compond (e.g. bisphenol A or novolak resin); a monomer described in U.S. Pat. No. 3,801,328; and a mixture thereof. Preferred are those having at least two unsaturated groups and being insoluble with water. The monomer having at least two unsaturated groups imparts water resistance to the printing plate and does not inhibit developing ability of the resin plate.

The photopolymerization initiator (D) of the present invention may be anyone that is known to the art. Typical examples of the photopolymerization initiators are benzoin ethers (such as benzoin isopropyl ether and benzoin isobutyl ether), benzophenones (such as benzophenone and methyl-o-benzoyl benzoate), xanthones (such as xanthone, thioxanthone and 2-chlorothioxanthone), acetophenones (such as acetophenone, trichloroacetophenone, 2,2-diethoxyacetophenone and 2,2-dimethoxy-2-phenylacetophenone), benzil, 2- ethylanthraquinone, methylbenzoylformate, 2-hydroxy-2-methylpropiophenone, 2-hydroxy-2-methyl-4'-isopropylisopropiophenone, 1-hydroxycyclohexyl phenyl ketone, a mixture thereof and the like.

The water developable photosensitive resin composition of the present invention can be prepared by mixing the above mentioned components (A), (B), (C) and (D). It is preferred that the acrylic resin (A) is present in an amount of about 30 to 90% by weight, preferably 40 to 80% by weight, the monomer (C) is present in an amount of about 5 to 70% by weight, preferably 10 to 15% by weight and the initiator (D) is in an amount of about 0.01 to 10% by weight, preferably 0.1 to 5% by weight, based on the total amount of the composition. The compound (B) may be preferably present in an amount of about 0.02 to 2.0 mol, more preferably 0.5 to 1.5 mol, based on one mol of the carboxyl group in the acrylic resin (A). If the amount of the acrylic resin is less than 30% by weight, the water developable photosensitive resin composition does not keep solid. If it is more than 90% by weight, the obtained composition does not cure sufficiently. Amounts of the monomer (C) of less than 5% by weight does not cure sufficiently and those of more than 70% by weight are poor in dimensional stability of the obtained composition. Amounts of the initiator (D) of less than 0.01% by weight are poor in photosensitivity and those of more than 10% by weight do not provide a printing plate having acceptable physical properties. If the compound (B) is less than 0.02 mol, the obtained resin plate is poor in water developing ability. If it is more than 2.0 mol, the obtained printing plate is poor in water resistance.

The resin composition of the present invention may further contain additives, if necessary, such as a polymerization inhibitor (e.g. hydroquinone, hydroquinone monomethyl ether, hydroquinone mono-t-butyl ether, catechol, p-t-butylcatechol, 2,6-di-t-butyl-p-cresol, benzoquinone, 2,5-diphenyl-p-benzoquinone and phenothiazine), a dye (e.g. eosine Y and Rose Bengal) and a plasticizer (e.g. dialkyl phthalate, dialkyl fumarate, dialkyl sebacate, dialkyl itaconate, alkyl phosphate, polyethylene glycol, polyethylene glycol esters, polyethylene glycol ethers).

The photosensitive resin composition of the present invention may be prepared by art-known methods, e.g. mixing in a kneader the above mentioned components. The resin composition may be coated or laminated on a substrate to form a photosensitive resin plate for printing. The resin composition can be formed on the substrate by extruding or calendering. The composition can be prepared in an aqueous medium by mixing the above mentioned components and then poured on the substrate, followed by drying to form the photosensitive resin plate. The substrate can be anyone that is known to the art, for example a plastic plate or sheet and a metal plate or sheet.

The photosensitive resin plate thus obtained is exposed to light, such as ultraviolet light, through a negative film having a suitable image to cure portions which are exposed to light. The resin plate is developed with water to form a printing plate.

As mentioned above, the photosensitive resin plate is very suitable for letterpress printing. The plate is also suitable for offset printing and screen printing.

The present invention provides a photosensitive resin plate which is excellent in water developing ability, and also provide a printing plate which is excellent in water resistance and abrasion resistance. Furthermore, the resin plate or printing plate has very excellent dimensional stability.

EXAMPLES

The present invention is illustrated by the following examples which, however, are not to be construed as limiting the present invention to their details. In the specification, "part" and "%" are based on weight, unless otherwise indicated.

Reference Example

Pretreatment of a steel plate

A primer composition having a viscosity of 950 cps/25° C. was prepared from the following ingredients;

| Ingredients | Parts |
|---|---|
| An aqueous emulsion of a copolymer of alkyl (meth)acrylates, having solid content 50%, pH 7.5 and viscosity 40 cps/25° C. | 100 |
| An ammonia dispersion of an ethylene-acrylic acid copolymer, having solid content 35%, pH 9.3 and viscosity 1,500 cps/25° C. | 150 |
| An ammonia dispersion of a urethane polymer with N-methyl-2-pyrrolidone, having solid content 35%, pH 8.5 and viscosity 400 cps/25° C. | 200 |
| An aqueous solution of 20% pigment yellow 17 and 13% nonionic surfactant | 200 |

The primer was coated on a degreased steel plate having a thickness of 0.18 mm with a reverse coater, and dried in a gas furnace at 180° C. for two minutes. The obtained primer had a thickness of about 10 microns.

EXAMPLE 1

One hundred parts of a monomer mixture of 20% methacrylic acid, 77% methyl methacrylate and 3% butyl acrylate was mixed with 300 parts of deionized water, 3.0 parts of sodium alkylbenzenesulfonate (NEOPELEX 05 available from Kao Corporation), 1.5 parts of a reactive emulsifying agent (Latemul 180 A available from Kao Corporation) and 3.0 parts of potassium persulfate, and polymerized at 90° C. for 8 hours in a nitrogen atmosphere. Its conversion into polymer was 98%. The obtained latex was salted out with 20 parts of aluminum chloride hexahydrate based on 100 parts of polymer, and dried to obtain a white polymer.

A photosensitive resin composition was prepared by mixing 100 parts of the obtained polymer, 36 parts of N,N-dimethylaminopropylmethacrylamide, 10 parts of phenoxyethoxyethanol, 50 parts of 2,2-bis[4-(methacryloxypolyethoxy)phenyl]propane, 4 parts of 2,2-dimethoxy-2-phenyl acetophenone, 0.6 parts of 2,6-di-t-butyl-p-cresol and 0.1 part of hydroquinone. The composition was extruded onto the primered steel plate of Reference Example by a kneader extruder having T die to obtain a photosensitive resin plate having a 0.4 mm photosensitive resin layer with a mirror surface.

A negative film was contacted with the surface of the above obtained resin plate, and exposed with a 3 Kw high pressure mercury lamp at a distance of 70 cm. Exposing time was one second for pre-exposure and 40 second for main exposure. The exposed plate was developed by spraying neutral water of 40° C. at a pressure of 4 Kg/cm² for one minute to obtain a relief plate. The relief plate was dried at 110° C. for two minutes to obtain a printing plate which was faithful to the negative film.

EXAMPLES 2 TO 4 AND COMPARATIVE EXAMPLES 1 TO 8

A polymer was obtained as generally described in Example 1, with the exception that the monomers and its composition were changed as shown in Table 1. A printing plate was also obtained as generally described in Example 1.

EXAMPLE 5

One part of potassium hydroxide was dissolved in 200 parts of deionized water, to which 2 parts of oleic acid (LUNAC OP available from Kao Corporation) was added and mixed at 50° C. for 60 minutes in a nitrogen gas flow. To the solution, 0.5 parts of sodium formaldehydesulfoxylate. A mixture of 20 parts of methacrylic acid, 60 parts of methyl methacrylate, 20 parts of butyl acrylate, 2 parts of dioctyl sulfosuccinate (PELEX OTP available from Kao Corporation) and 0.5 parts of t-butyl hydroperoxide was then added dropwise at 60° C. for 4 hours in a nitrogen gas flow. After completion of the addition, it was further mixed for 4 hours with heating to obtain a white latex. Its polymer conversion of the latex was 99%. The latex was salting out with 2 parts of hydrochloric acid and 5 parts of calcium chloride, and dried to obtain a white polymer. Using the polymer, a printing plate was obtained as generally described in Example 1.

EXAMPLE 6

A printing plate was prepared as generally described in Example 4, with the exception that 15 parts of N,N-dimethylaminopropylmethacrylamide (0.05 mol per one mol of carboxyl group in the copolymer) and 18 parts of 2-N-morpholinoethanol (0.75 mol per one mol of carboxyl group in the copolymer) were employed instead of 36 parts of N,N-dimethylaminopropylmethacrylamide.

Example 7

A printing plate was prepared as generally described in Example 4, with 20 parts in 50 parts of 2,2-bis[4-(methacryloxypolyethoxy)phenyl]propane was changed with 20 parts of 2-hydroxyethyl methacrylate.

EXAMPLE 8

A printing plate was prepared as generally described in Example 1, with the exception that N,N-dimethylaminoethyl-N'-methacryloyl carbamate was employed in an amount of 0.75 mol based on one mol of carboxyl group, instead of 36 parts of N,N-dimethylaminopropylmethacrylamide.

EXAMPLE 9

A printing plate was prepared as generally described in Example 1, with the exception that N,N-dimethylaminoethoxyethanol was employed in an amount of 0.80 mol based on one mol of carboxyl group, instead of 36 parts of N,N-dimethylaminopropylmethacrylamide.

EXAMPLE 10

A printing plate was prepared as generally described in Example 1, with the exception that N,N-dimethylalminopropylacrylamide was employed in an amount of 1.33 mol based on one mol of carboxyl group, instead of 36 parts of N,N-dimethylaminopropylmethacrylamide.

EXAMPLE 11

A printing plate was prepared as generally described in Example 1, with the exception that N,N-dimethylaminopropylmethacrylamide was employed in an amount of 0.63 mol based on one mol of carboxyl group.

EXAMPLE 12

A kneader was charged with 50 parts of the polymer of Example 1, 50 parts of the polymer of Example 3 and 150 parts of purified water and dispersed at 70° to 75° C. Then, a mixture of 4 parts of 2,2-dimethoxy-2-phenylacetophenone, 0.6 parts of 2,6-di-t-butyl-p-cresol, 0.1 part of hydroquinone, 10 parts of phenoxyethoxyethanol, 60 parts of 2,2-bis[4-(methacryloxypolyethoxy)phenyl]propane and 37 parts of N,N-dimethylaminoethyl methacrylate was added dropwise for 20 minutes. The obtained mixture was defoamed and poured on a steel substrate of Reference Example. A polyethylene-terephthalate sheet of 0.1 mm thickness was contacted on the surface of the resin composition layer, which was then passed between two rollers which were adjusted to obtain a resin layer of 0.7 mm, to obtain a sheet. After cooling it, the polyethylene-terephthalate sheet was removed and appeared resin layer was dried at 80° C. in a drying furnace for 50 minutes to obtain a photosensitive resin plate.

COMPARATIVE EXAMPLE 9

A printing plate was prepared as generally described in Example 4, with the exception that N,N-dimethylaminoethyl methacrylate was employed in an amount of 0.18 mol based on one mol of carboxyl group, instead of 36 parts of N,N-dimethylaminopropylmethacrylamide.

COMPARATIVE EXAMPLE 10

A kneader was charged with 100 parts of partially saponified polyvinyl acetate (average polymerization degree 500, saponification degree 80.1 mol %) and 80 parts of purified water and dispersed at 90° to 95° C. for 30 minutes. After heating it to 60° C., a mixture of 0.06 parts of p-methoxyphenol, 0.1 part of 2,6-di-t-butyl-p-cresol, 3 parts of 2,2-dimethoxy-2-phenylacetophenone, 100 parts of 2-hydroxyethyl methacrylate and 20 parts of trimethylolpropane triacrylate was added dropwise for 40 minutes. The obtained mixture was defoamed and poured on a 0.18 mm steel substrate which had been coated with an antihalation agent. A polyethylene-terephthalate sheet of 0.1 mm thickness was contacted on the surface of the resin composition layer, which was then passed between two rollers which were adjusted to obtain a resin layer of 0.6 mm, to obtain a sheet. After cooling it, the polyethylene-terephthalate sheet was removed and the appeared resin layer was dried at 80° C. in a drying furnace for 40 minutes to obtain a photosensitive resin plate.

COMPARATIVE EXAMPLE 11

A printing plate was prepared as generally described in Example 1, with the exception that a polymer was prepared in the manner of Japanese Kokai Publication 22339/1986 from the monomers shown in Table 1.

Evaluation of physical properties

In the above mentioned Examples and Comparative Examples, evaluations were made on physical properties ($T_g$, AV, NaOH solubility) of the polymer, productivity (compatibility, tackiness) of the photosensitive resin composition, deformation resistance of the laminated plate, developing properties of the relief plate and printing properties of the printing plate. Their results are shown in Table 1.

6) Itaconic acid.
7) Acrylic acid.
8) A polymer sample (1 g) with 10 to 200 mesh was dispersed in 100 ml of a 1% sodium hydroxide aqueous solution and allowed to stand for 12 hours at ambient temperature with mixing. Its polymer condition in the solution was evaluated by eyes as three grades (insoluble, swelling, soluble).
9) While mixing the photosensitive resin composition in the kneader, mixing time is changed 10 minutes, 20 minutes and 30 minutes at which samples were respectively obtained and formed to 1 mm thick plates. Evaluations were made on whether impurities are present or not. is nothing, Δ is a little, x is many.

TABLE 1

| | Salting agent | Monomer composition (wt %) | | | | | | | Polymer properties | | | Workability | |
| | | MMA[1] | BMA[2] | BA[3] | EA[4] | MAA[5] | IA[6] | AA[7] | $T_g$ (°C.) | AV (mg KOH/g) | NaOH[8] Solubility | Compatibility[9] | Tackiness[10] |
|---|---|---|---|---|---|---|---|---|---|---|---|---|---|
| Examples No. | | | | | | | | | | | | | |
| 1 | Aluminum | 77 | — | 3 | — | 20 | — | — | 110 | 120 | insoluble | ○ | ○ |
| 2 | chloride | 74 | — | 10 | — | 16 | — | — | 90 | 100 | | ○ | ○ |
| 3 | | 69 | — | 11 | — | 20 | — | — | 90 | 100 | | ○ | ○ |
| 4 | | 67 | — | 17 | — | 16 | — | — | 75 | 100 | | ○ | ○ |
| 5 | CaCl$_2$ | 60 | — | 20 | — | 20 | — | — | 72 | 110 | | ○ | ○ |
| 6 | Aluminum | 67 | — | 17 | — | 16 | — | — | 75 | 100 | | ○ | ○ |
| 7 | chloride | 67 | — | 17 | — | 16 | — | — | 75 | 100 | | ○ | ○-Δ |
| 8 | | 77 | — | 3 | — | 20 | — | — | 110 | 120 | | ○ | ○ |
| 9 | | 77 | — | 3 | — | 20 | — | — | 110 | 120 | | ○ | ○ |
| 10 | | 77 | — | 3 | — | 20 | — | — | 110 | 120 | | ○ | ○-Δ |
| 11 | | 77 | — | 3 | — | 20 | — | — | 110 | 120 | | ○ | ○ |
| 12 | | See Example 12 | | | | | | | — | — | | ○ | ○ |
| Comparative examples No. | | | | | | | | | | | | | |
| 1 | Aluminum | 38 | — | 46 | — | 16 | — | — | 23 | 100 | soluble | ○ | x |
| 2 | chloride | 64 | — | — | — | 36 | — | — | 130 | 148 | insoluble | x | ○ |
| 3 | | 43 | — | 20 | — | 37 | — | — | 80 | 150 | soluble | ○ | x |
| 4 | | 81 | — | 12 | — | 7 | — | — | 80 | 60 | insoluble | ○ | ○-Δ |
| 5 | | 49 | — | 31 | — | 20 | — | — | 50 | 120 | soluble | ○ | x |
| 6 | | 90 | — | — | — | 10 | — | — | 113 | 80 | insoluble | ○-Δ | ○ |
| 7 | | — | 80 | — | 16.5 | — | 3.5 | — | 16 | 50 | soluble | ○-Δ | x |
| 8 | | 60 | — | — | — | 20 | — | 20 | 122 | 160 | soluble | x | x |
| 9 | | 67 | — | 17 | — | 16 | — | — | 75 | 110 | insoluble | Δ | ○ |
| 10 | | See Comparative example 10 | | | | | | | — | — | — | ○ | ○ |
| 11 | — | 67 | — | 17 | — | 16 | — | — | 75 | 100 | soluble | ○ | x |

| | Resin plate properties | Plate making properties | | Printing properties | | | |
| | Deformation resistance[11] | Developing ability[12] | Reproducibility of a dot pattern[13] | Swelling degree[14] | Cracks[15] | Reproducibility of types[16] | Print wear[17] |
|---|---|---|---|---|---|---|---|
| Examples No. | | | | | | | |
| 1 | ○ | ○ | ○ | ○-Δ | ○-Δ | ○-Δ | ○ |
| 2 | ○-Δ | ○ | ○ | ○ | ○ | ○ | ○ |
| 3 | ○ | ○ | ○ | ○ | ○ | ○ | ○ |
| 4 | ○ | ○ | ○ | ○ | ○ | ○ | ○ |
| 5 | ○-Δ | ○ | ○ | ○ | ○ | ○ | ○ |
| 6 | ○ | ○ | ○ | ○ | ○ | ○ | ○ |
| 7 | Δ | ○ | ○ | Δ | ○ | ○ | Δ |
| 8 | ○ | ○ | ○ | ○ | ○-Δ | ○ | ○ |
| 9 | ○ | ○ | ○ | ○ | ○-Δ | ○ | ○ |
| 10 | ○-Δ | ○ | ○-Δ | ○-Δ | ○-Δ | ○-Δ | ○-Δ |
| 11 | ○ | ○ | ○ | ○ | ○ | ○ | ○ |
| 12 | ○ | ○ | ○ | ○ | ○ | ○ | ○ |
| Comparative examples No. | | | | | | | |
| 1 | x | ○ | x | x | ○ | ○ | x |
| 2 | ○ | x | Δ | ○ | x | x | x |
| 3 | x | ○ | Δ | x | ○ | ○ | x |
| 4 | ○ | x | Δ | ○ | ○ | ○ | ○ |
| 5 | x | ○ | ○ | x | ○ | ○ | x |
| 6 | ○ | x | Δ | ○ | ○-Δ | ○ | Δ |
| 7 | x | xx | x | ○ | ○ | Cannot print | Cannot print |
| 8 | Δ | ○ | x | x | Δ | Δ | x |
| 9 | ○ | xx | x | ○ | ○ | Cannot print | Cannot print |
| 10 | ○ | ○ | ○ | x | ○ | Δ | x |
| 11 | Δ | Δ | ○ | x | ○ | ○ | x |

1) Methyl methacrylate.
2) Butyl methacrylate.
3) Butyl acrylate.
4) Ethyl acrylate.
5) Methacrylic acid.

10) Evaluations were made from adhesive properties of samples used in the evaluation 9) to the kneader blades, and peel strength after pressing the samples on a tin plate; shows that it is easy to peel, Δ shows that it is slightly difficult to peel, x shows that it is difficult to peel.

11) A rubber plate having a diameter of 20 mm was placed on the laminate plate and a weight of 3 Kg was put on the rubber plate for one minute. A depth of the dent was measured. After removing the weight, the plate was exposed and developed by a normal method to determine an effect of the dent on the developing ability. shows no effect, Δ shows slightly effect, x shows much effect.

12) In a relief plate after exposing and developing, a height of an image portion and a depth of a non-image portion were determined and shows that the depth of the non-image portion is more than 80% of the height of the image portion, Δ shows that it is within the range of 50 to 80%, x shows that it is within the range of 20 to 50% and xx shows less than 20%.

13) A resin plate was exposed and developed using a dot pattern negative film and evaluations were made on reproducibility of the dot pattern. shows good reproducibility, Δ shows fairly good reproducibility and x shows poor reproducibility.

14) The printing plate was immersed in water and emulsion ink at 40° C. for one hour. Evaluations were made on swelling degree; shows no swelling, Δ shows slightly swelling and x shows highly swelling.

15) The cured resin plate was bent and evaluations were made on cracks of the surface; shows no cracks, Δ shows a little cracks and x shows many cracks.

16) Reproducibility of types was evaluated; o shows good reproducibility, Δ shows fairly good reproducibility and x shows poor reproducibility.

17) Number of printed sheets was determined using a 35% water containing emulsion ink which was available from Toyo Ink Co., Ltd.; shows more than 140,000 copies, shows more than 70,000 copies and x shows less than 20,000.

What is claimed is:

1. A water developable photosensitive resin composition comprising
    (A) an acrylic resin of which glass transition temperature ($T_g$), as defined by $$\frac{W_1}{T_{g1}} + \frac{W_2}{T_{g2}} + \ldots = \frac{1}{T_{g0}}$$

wherein $T_{g1}$, $T_{g2}$, ... represents a glass transition temperature of a homopolymer prepared from each monomer, $T_{g0}$ represents a glass transition of a copolymer obtained from the monomer and $W_1$, $W_2$, ... shows a weight fraction of each monomer and wherein the acrylic resin has carboxyl group(s) and has an acid value (AV) satisfying the following relationships:

$$60° C. \leq T_g \leq 125° C.$$

$$80 \text{ mg KOH/g} \leq AV \leq 130 \text{ mg KOH/g, and}$$

$$T_g - 10 \leq AV \leq T_g + 40$$

(B) a basic nitrogen atom-containing compound,
    (C) an ethylenically unsaturated monomer, and
    (D) a photopolymerization initiator.

2. The water developable photosensitive resin composition according to claim 1 wherein said acrylic resin has a glass transition temperature of 70° to 120° C. and an acid value of 90 to 120 mg KOH/g.

3. The water developable photosensitive resin composition according to claim 1 wherein said acrylic resin (A) is prepared by copolymerizing a monomer mixture which comprising 10 to 20% by weight of alpha, beta-unsaturated carboxylic acid, 30 to 90% by weight of an alkyl methacrylate, 0 to 50% by weight of an alkyl acrylate and 0 to 20% by weight of a copolymerizable monomer.

4. The water developable photosensitive resin composition according to claim 1 wherein said acrylic resin (A) is in the form of powder prepared by a salting out method.

5. The water developable photosensitive resin composition according to claim 4 wherein a salting agent employed in the salting out method is calcium or aluminum.

6. The water developable photosensitive resin composition according to claim 1 wherein said basic nitrogen atom-containing compound (B) contains both the tertiary amino group and a vinyl group.

7. The water developable photosensitive resin composition according to claim 6 wherein said compound (B) is a compound represented by the formula:

wherein n is 1, 2 or 3, X is 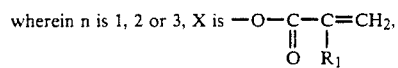

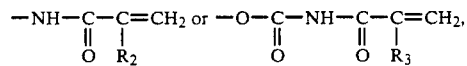

$R_1$, $R_2$ and $R_3$ respectively show H or methyl, or a compound represented by the formula:

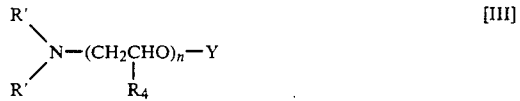

wherein Y is H, 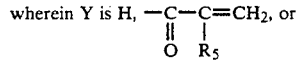

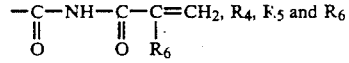

respectively show H or methyl, n is an integer of 1 to 6 when R' is methyl and 2 to 6 when R' is ethyl.

8. The water developable photosensitive resin composition according to claim 1 wherein said ethylenically unsaturated monomer (C) is selected from the group consisting of an unsaturated carboxylic ester, an unsaturated amide, a divinyl ester and a (meth)acrylated urethane prepared by reacting a hydroxyalkyl (meth)acrylate with an isocyanate compound.

9. The water developable photosensitive resin composition according to claim 1 wherein said photopolymerization initiator (D) are selected from the group consisting of benzoin ethers, benzophenones, acetophenones, benzil, 2-ethylanthraquinone, methylbenzoylformate, 2-hydroxy-2-methylpropiophenone, 2-hydroxy-2-methyl-4'-isopropylisopropiophenone and 1-hydroxycyclohexyl phenyl ketone.

10. The water developable photosensitive resin composition according to claim 1 wherein said acrylic resin (A) is present in an amount of 30 to 90% by weight, said monomer (C) is present in an amount of 5 to 70% by weight and said initiator (D) is in an amount of 0.01 to 10% by weight, based on the total amount of the composition.

11. The water developable photosensitive resin composition according to claim 1 wherein said compound (B) is present in an amount of about 0.02 to 2.0 mol, based on one mol of carboxyl group(s) in the acrylic resin (A).

12. The water developable photosensitive resin composition according to claim 1, which further comprises a polymerization inhibitor, a dye and a plasticizer.

13. A water developable photosensitive resin plate comprising a substrate and the water developable photosensitive resin composition according to claim 1 coated thereon.

* * * * *